(12) United States Patent
Anderson et al.

(10) Patent No.: US 10,937,793 B2
(45) Date of Patent: Mar. 2, 2021

(54) VERTICAL TRANSISTOR CONTACT FOR A MEMORY CELL WITH INCREASED DENSITY

(71) Applicant: INTERNATIONAL BUSINESS MACHINES CORPORATION, Armonk, NY (US)

(72) Inventors: Brent A. Anderson, Jericho, VT (US); Terence B. Hook, Jericho, VT (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/699,980

(22) Filed: Dec. 2, 2019

(65) Prior Publication Data

US 2020/0105769 A1    Apr. 2, 2020

Related U.S. Application Data

(63) Continuation of application No. 16/023,434, filed on Jun. 29, 2018, now Pat. No. 10,559,572.

(51) Int. Cl.
  *H01L 27/11* (2006.01)
  *H01L 21/768* (2006.01)
  *H01L 23/522* (2006.01)

(52) U.S. Cl.
  CPC .... *H01L 27/1104* (2013.01); *H01L 21/76805* (2013.01); *H01L 23/5226* (2013.01); *H01L 21/76843* (2013.01)

(58) Field of Classification Search
  CPC combination set(s) only.
  See application file for complete search history.

(56) References Cited

U.S. PATENT DOCUMENTS

| | | | |
|---|---|---|---|
| 6,137,129 A | 10/2000 | Bertin et al. |
| 6,759,699 B1 | 7/2004 | Chi |
| 7,138,685 B2 | 11/2006 | Hsu et al. |
| 7,678,658 B2 | 3/2010 | Yang et al. |
| 8,035,170 B2 | 10/2011 | Inaba |
| 8,169,030 B2 | 5/2012 | Masuoka et al. |
| 8,409,948 B2 | 4/2013 | Fischer et al. |
| 8,692,317 B2 | 4/2014 | Takeuchi |
| 8,853,700 B2 | 10/2014 | Sardesai et al. |
| 9,362,292 B1 | 6/2016 | Liaw |

(Continued)

OTHER PUBLICATIONS

A.Veloso, et al., "Challenges and Opportunities of Vertical FET Devices using 3D Circuit Design Layouts", IEEE, 2016, p. 1-3.

(Continued)

*Primary Examiner* — Nduka E Ojeh
(74) *Attorney, Agent, or Firm* — Cantor Colburn LLP; Douglas Pearson

(57) ABSTRACT

According to an embodiment of the present invention a semiconductor device includes a plurality of transistors, wherein each of the plurality of transistors includes a vertical fin. The vertical fin includes a bottom source or drain (S/D) and a top (S/D) each formed in a doped region. The fin also includes a gate wrapping around a channel region. A bottom contact is connected to the gate, the first doped region and a second doped region. Each of the plurality of transistors is operably connected to form the semiconductor device.

12 Claims, 13 Drawing Sheets

(56) References Cited

U.S. PATENT DOCUMENTS

| | | |
|---|---|---|
| 9,530,866 B1 | 12/2016 | Zhang et al. |
| 10,079,229 B1 | 9/2018 | Bi et al. |
| 10,083,971 B1* | 9/2018 | Zang .................. H01L 29/785 |
| 10,163,915 B1 | 12/2018 | Zang et al. |
| 2008/0274600 A1 | 11/2008 | Mathew et al. |
| 2011/0062523 A1* | 3/2011 | Masuoka ........ H01L 21/823885 257/368 |
| 2015/0179655 A1 | 6/2015 | Nakanishi et al. |
| 2015/0318288 A1 | 11/2015 | Lim et al. |
| 2015/0318289 A1 | 11/2015 | Liaw |
| 2016/0078922 A1* | 3/2016 | Liaw .................. H01L 27/1104 365/51 |
| 2017/0005101 A1* | 1/2017 | Anderson ......... H01L 21/28008 |
| 2017/0179116 A1* | 6/2017 | Anderson ............. H01L 29/665 |
| 2017/0345897 A1 | 11/2017 | Kang et al. |
| 2018/0174642 A1 | 6/2018 | Huynh Bao et al. |
| 2018/0330997 A1 | 11/2018 | Ryckaert et al. |
| 2019/0363176 A1 | 11/2019 | More et al. |
| 2020/0235092 A1 | 7/2020 | Lilak et al. |

OTHER PUBLICATIONS

Anderson et al., "Vertical Transistor Contact for a Memory Cell With Increased Density," U.S. Appl. No. 16/023,434, filed Jun. 29, 2018.

Brent A. Anderson et al., "Vertical Transistor Contact for Cross-Coupling in a Memory Cell", U.S. Appl. No. 16/023,421, filed Jun. 29, 2018.

List of IBM Patents or Patent Applications Treated as Related; Date Filed: Dec. 2, 2019, 2 pages.

Trong Huynh-Bao, et al., "Toward the 5nm Technology: Layout Optimization and Performance Benchmark for Logic/SRAMs Using Lateral and Vertical GAA FETs", Proc. of SPIE vol. 9781, 2016, p. 1-12.

Brent A. Anderson et al., "Vertical Transistor Contact for Cross-Coupling in a Memory Cell", U.S. Appl. No. 16/747,838, filed Jan. 21, 2020.

List of IBM Patents or Patent Applications Treated as Related; Date Filed: Jan. 21, 2020, 2 pages.

* cited by examiner

VERTICAL TRANSISTOR CONTACT FOR A MEMORY CELL WITH INCREASED DENSITY

DOMESTIC PRIORITY

This application is a continuation of U.S. patent application Ser. No. 16/023,434, filed Jun. 29, 2018, the disclosure of which is incorporated by reference herein in its entirety.

BACKGROUND

The present invention generally relates to fabrication methods and resulting structures for semiconductor devices. More specifically, the present invention relates to fabrication methods and resulting structures for vertical transistors, wherein the contacts of the vertical transistor are configured and arranged to increase the density in a memory cell.

The metal oxide semiconductor field effect transistor (MOSFET) is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

A type of MOSFET is a non-planar FET known generally as a vertical field effect transistor (VFET). VFETs employ semiconductor fins and side-gates that can be contacted outside the active region, resulting in increased device density and some increased performance over lateral devices. In VFETs, the source to drain current flows in a direction that is perpendicular to a major surface of the substrate. For example, in a known VFET configuration, a major substrate surface is horizontal, and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

According to an embodiment of the present invention, a semiconductor device includes a plurality of transistors, wherein each of the plurality of transistors includes a vertical fin. The vertical fin includes a bottom source or drain (S/D) and a top (S/D) each formed in a doped region. The fin also includes a gate wrapping around a channel region. A bottom contact is connected to the gate, the first doped region and a second doped region. Each of the plurality of transistors is operably connected to form the semiconductor device.

Figure 1:
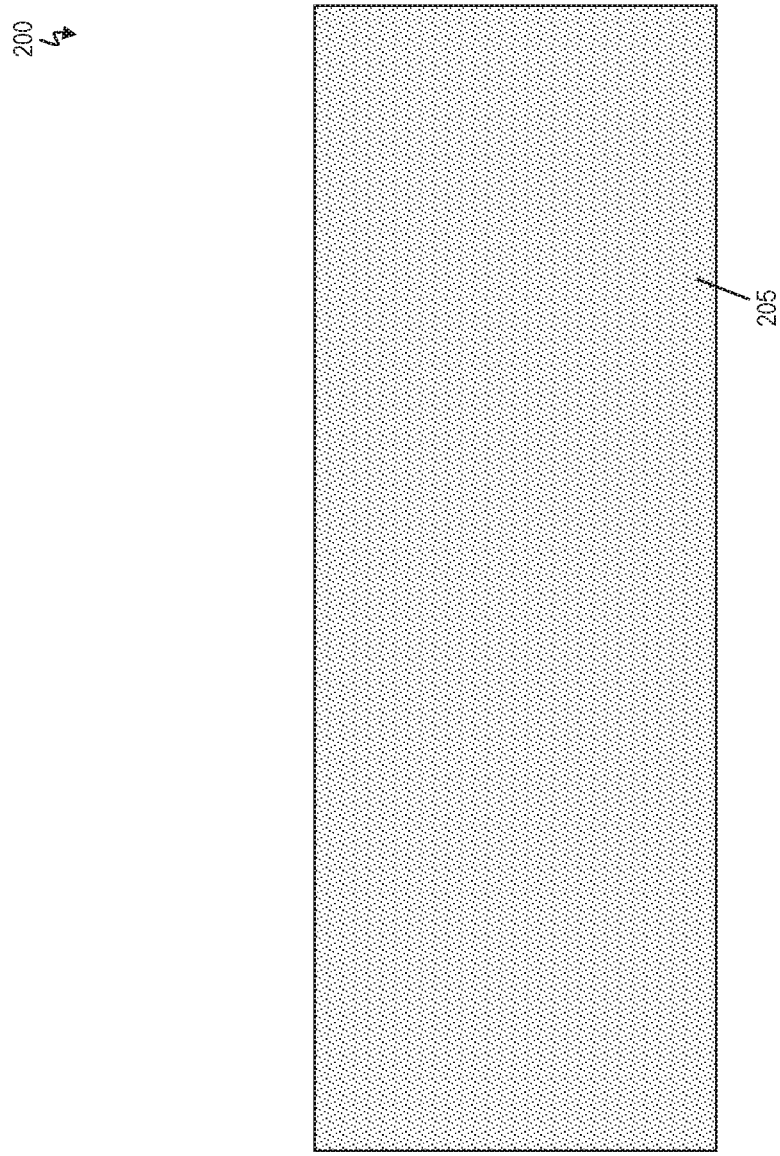
FIG. 1 is a cross-sectional view of a structure that results from performing initial fabrication operations according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of one or more embodiments of the present invention are unique. Thus, the unique combination of the operations described in connection with the fabrication of a semiconductor device utilizing a non-selective low temperature deposition process for forming the top S/D in a VFET device followed by a low temperature oxidation process to form the non-uniform top spacer according to one or more embodiments of the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Turning now to an overview of technologies that are more specifically relevant to aspects of the invention, vertical field effect transistor (FET) devices provide opportunities to increase device density on a wafer. Vertical FET devices have a source/drain (S/D) region arranged on a substrate. The channel region is arranged vertically above the substrate such that the gate stack can wrap around the channel region.

VFET devices have been a promising candidate for designing next generation SRAM memory. Static Random Access Memory (Static RAM or SRAM) is a type of RAM that holds data in a static form, that is, as long as the memory has power. A typical SRAM has address lines, data lines, and control lines. The address lines are used to identify the location of the memory storage element(s) or cell(s) to be read from or written to. The data lines contain the value of the data read or being written into the memory cells accessed. The control lines are used to direct the sequence of steps needed for the read or write operations of the SRAM.

SRAM circuits typically use 4 to 6 transistors. The transistors are designed to form cross-coupled inverters that can hold a '1' or '0' state as long as the circuit has power. A pair of cross-coupled inverters have the output of one inverter going into the input of the other and vice versa, such that the output (and input) of one inverter is the complement of that of the other.

In SRAM design, SRAM density (i.e., the number of transistors per $cm^2$ of a chip) is a key feature for chip size scaling and lithography alignment tolerance, which can significantly impact an SRAM cell size. The need for SRAM cell with an increased density is desired due to emerging applications in consumer electronics and wireless communications that process, transmit, and receive high-quality graphics at high speeds.

In addition, transistors used to form an SRAM circuit include a bottom contact (BC) which can used to connect a cross-couple gate to a bottom S/D also employs a lithography process. However, the lithography process to create the BC does not self-align the BC to the gate. Having a BC that is not self-aligned to the gate can be problematic from an area perspective due to the fact that space in a VFET SRAM cell is limited (i.e., a tight cell) and having a misaligned BC in a tight cell can cause circuit failures.

Turning now to an overview of the aspects of the invention, one or more embodiments of the invention address the above-described shortcomings of the prior art by providing a VFET SRAM circuit design that can account for lithography variations while increasing density. A VFET SRAM design according to aspects of the invention employs a cross-coupling scheme that accounts for the above-described variations by utilizing a self-aligned BC which also has a reduced profile to the BC residing within N+ and P+ regions of a semiconductor device. Accordingly, the proposed SRAM VFET design can account for a limited design area in a tight cell.

The above-described aspects of the invention address the shortcomings of the prior art by implementing a self-aligned BC scheme that forms a BC that is self-aligned to a gate and has a reduced profile. Having a self-aligned BC prevents circuit failures due to the BC overlapping another component or connection of the VFET SRAM cell. Reducing the profile of the BC can be used to increase SRAM cell density.

According to one or more embodiments, it should be appreciated that a fabrication process to build a vertical transistor, such as the VFET 100 is discussed below with reference to intermediate structures 200 shown in FIGS. 1-11. The intermediate structures show the structure that results from performing the described fabrication operations.

In FIG. 1, known fabrication operations have been used to fabricate a structure 200 according to one or more embodiments of the invention. The structure 200 includes a substrate 205. The substrate 205 can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate 205. In one or more embodiments of the present invention, when substrate 205 is a remaining semiconductor material portion of a bulk semiconductor substrate, the substrate 205 can be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin can include the same semiconductor material, or a different semiconductor material, from substrate 205.

In other embodiments, substrate 205 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate can be a non-semiconductor material including, for example, a dielectric material and/or a conductive material. In yet other embodiments, the handle substrate can be omitted and the substrate 205 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate and that can be employed as substrate 205 can be a crystalline or non-crystalline oxide and/or nitride. In one or more embodiments, the insulator layer can bean oxide such as, for example, silicon dioxide. In some embodiments, the insulator layer can be a nitride such as, for example, silicon nitride or boron nitride. In yet other embodiments, the insulator layer can be a multilayered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from 10 nm to 100 nm. Other thicknesses that are lesser than, or greater than, the aforementioned thickness range can also be used as the thickness of the semiconductor layer of the SOI substrate. The insulator layer of the SOI substrate can have a thickness from 1 nm to 200 nm. Other thicknesses that are lesser than, or greater than, the aforementioned thickness range can also be employed as the insulator layer.

Figure 2:
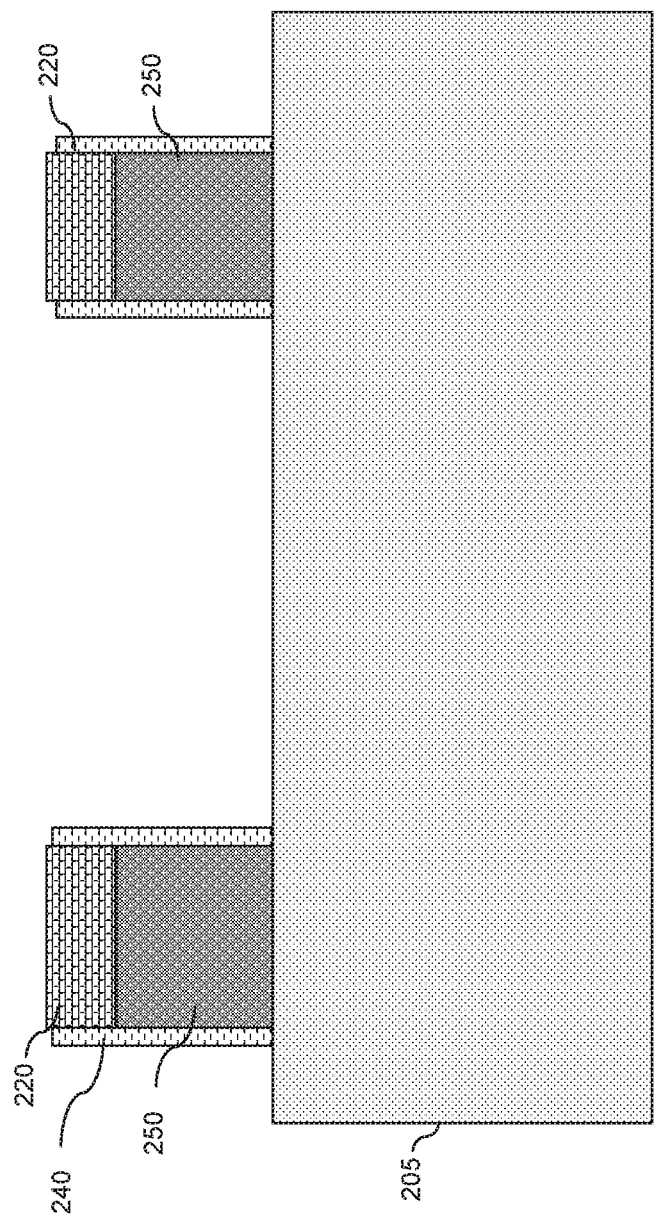
FIG. 2 is a cross-sectional view of the structure after formation of one or more fins according to one or more embodiments of the present invention.

FIG. 2 is a cross-sectional view of the structure 200 after formation of one or more fins according to one or more embodiments. The substrate 205 can be formed into vertical fins 250 extending in the z-axis. A hard mask 220 can be formed on top of the vertical fins 250. In one implementation, the hard mask 220 can be patterned according to the desired width of the fins 250. The pattern of the hard mask 220 can be etched through a channel layer to form the vertical fins 215. In an implementation, the hard mask 220 can be a nitride, such as, SiN.

A spacer layer 240 can be directionally deposited onto the substrate 205 and along vertical fins 250 and hard mask 220. The spacer layer 240 can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of spacer layer 240, an etch-back process can be performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the spacer layer 240 can be a low k dielectric material. Exemplary low k dielectric materials include, but are not limited to, dielectric oxynitrides (e.g., SiOCN) or any other suitable oxide.

In some exemplary embodiments, the spacer layer 240 can include a material that is resistant to some etching processes such as, for example, HF chemical etching or chemical oxide removal etching. In one or more embodiments, the spacer layer 240 can have a thickness in the range of about 3 nm to about 10 nm, or in the range of about 4 nm to about 6 nm.

Figure 3:
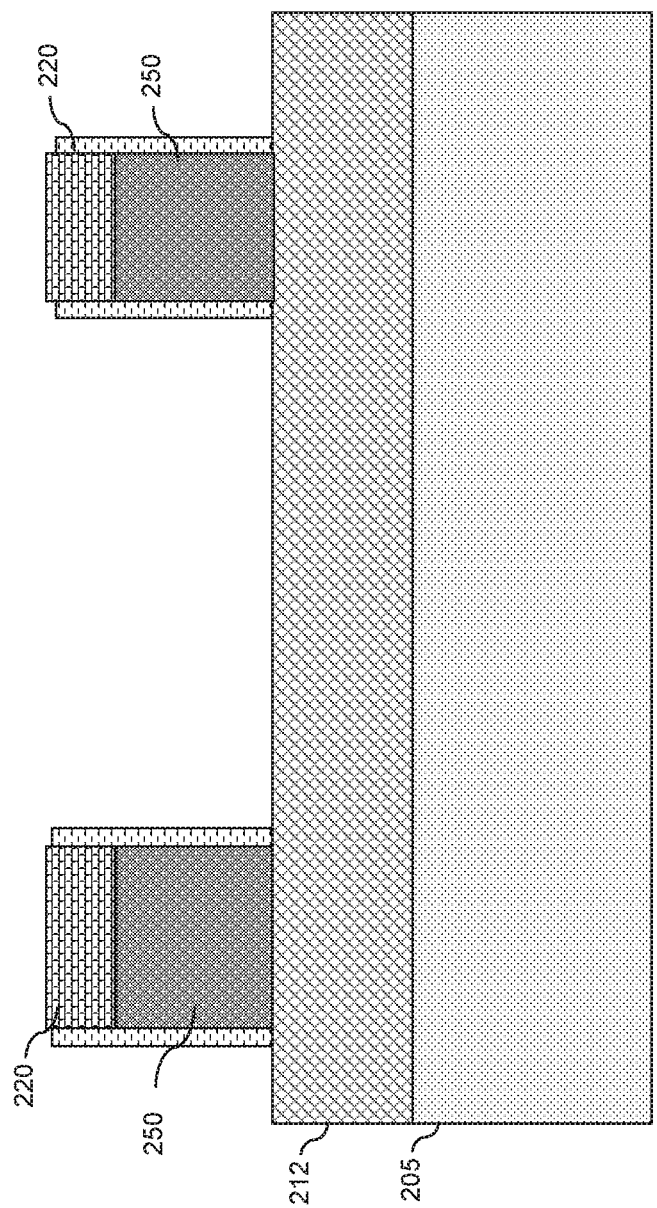
FIG. 3 is a cross-sectional view of the structure after implantation of a doped layer according to one or more embodiments of the present invention.

FIG. 3 is a cross-sectional view of the structure 200 after implantation of a doped layer 212 according to one or more embodiments of the present invention. A doped layer 212 can be implanted into the substrate 205. The doped layer 212 can be implanted using, for example, ion implantation. The doped epitaxial layer 212 can be doped N+ (i.e., highly doped n-type impurity concentrations in the $10^{18}$ to $10^{20}$ cm$^{-3}$ range) for building nFET (n-type). The doped epitaxial layer 212 can be patterned as desired.

Figure 4:
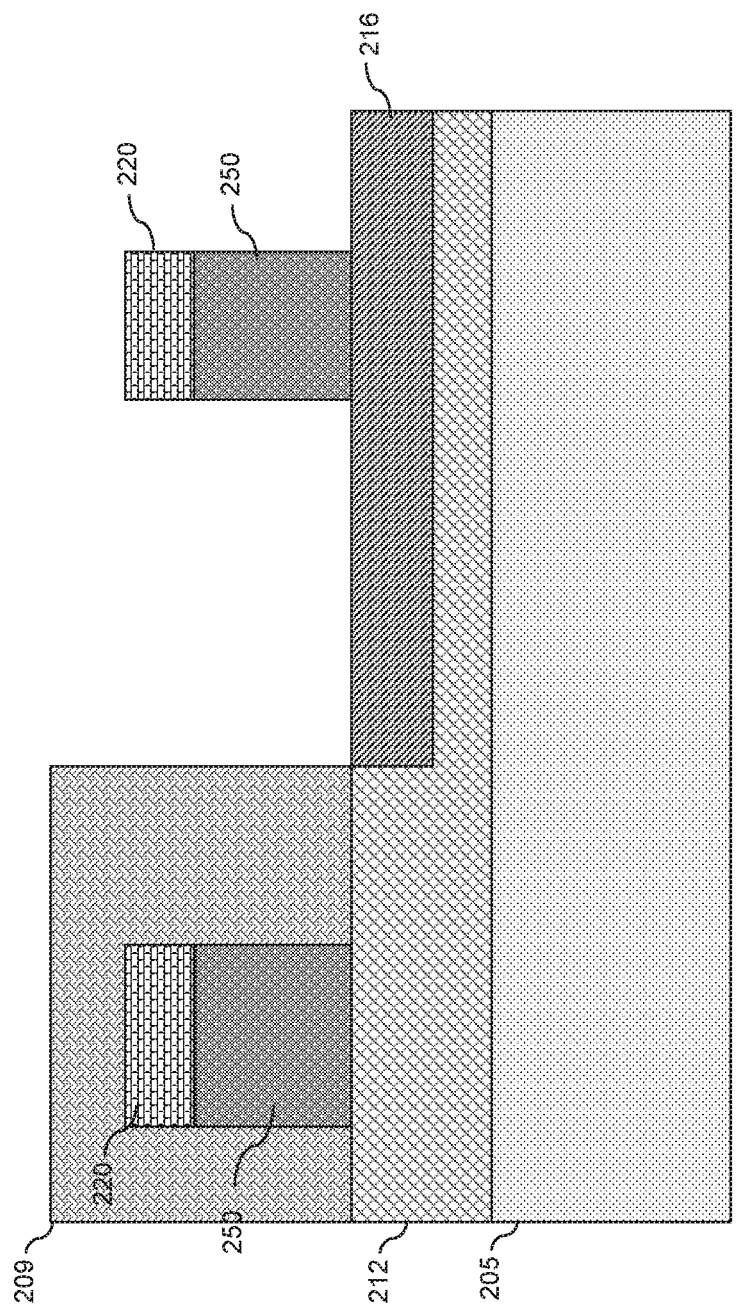
FIG. 4 is a cross-sectional view of the structure after a first mask formation and an addition of a doped layer within the doped layer according to one or more embodiments of the present invention.

FIG. 4 is a cross-sectional view of the structure 200 after a first mask formation and an addition of a doped layer within the doped layer 212 according to one or more embodiments of the present invention. A mask 209 can be formed on portions of hard mask 220 and spacer layer 240 of a first fin 250, as well as N+ region 212. Mask 209 can include, for example, a silicon nitride (SiN) hardmask. The mask 209 can be deposited using a deposition process, including, but not limited to, PVD, CVD, PECVD, or any combination thereof. Other mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The mask 209 can have a single material or multiple materials.

Portions of the doped layer 212 can be etched, and a doped layer 216 can be deposited on an exposed portion of the doped layer 212. The doped layer 216 can be doped P+ (i.e., highly doped p-type impurity concentrations in the $10^{18}$ to $10^{20}$ cm$^{-3}$ range) for building pFET (p-type) structures. The doped layer 212 can extend below the doped layer 216.

The doped layer 216 can be formed by epitaxial growth and/or deposition. As used herein, the terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one or more embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The particular epitaxial region is not intended to be limited and will generally depend on the type of VFET being formed.

The epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 500° C. to 900° C.

Figure 5:
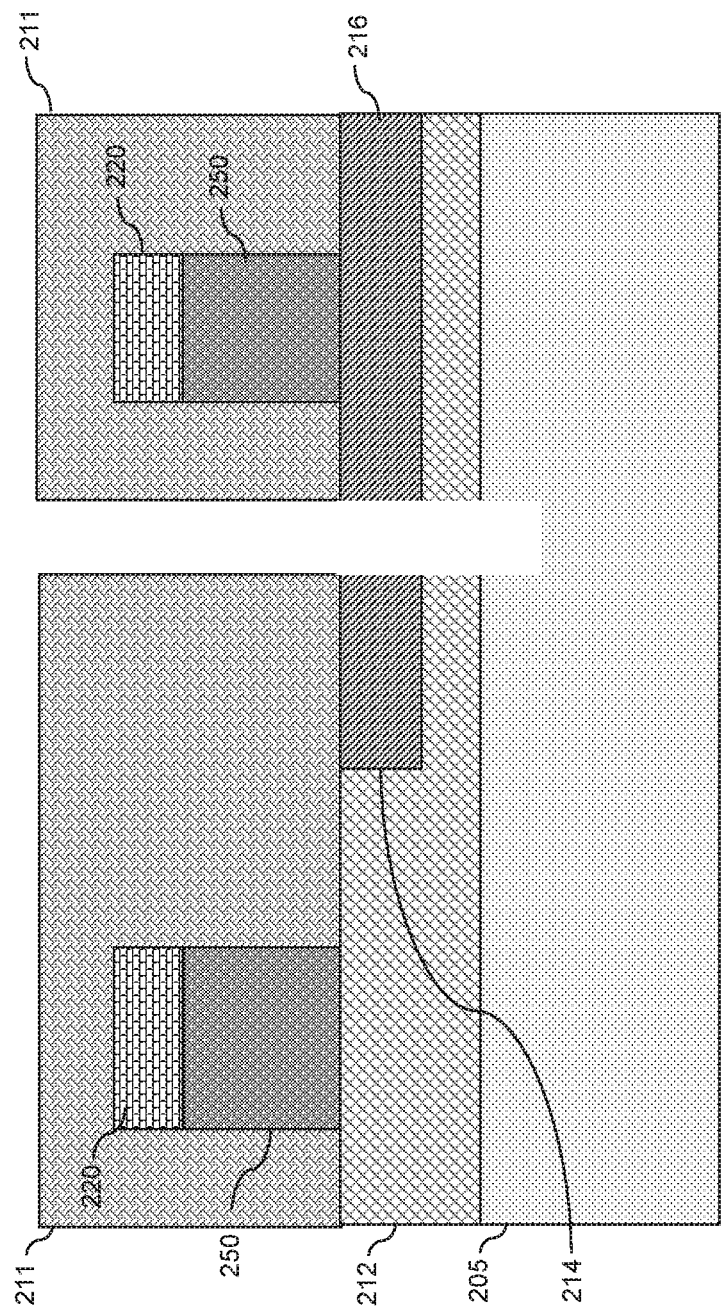
FIG. 5 is a cross-sectional view of the structure after the removal of the first mask, formation of a second mask and the removal of portions of the N+ region, the P+ region and substrate according to one or more embodiments of the present invention.

FIG. 5 is a cross-sectional view of the structure 200 after removal of the first mask, formation of a second mask and the removal of portions of the N+ region 212, the P+ region 216 and substrate 205 according to one or more embodiments of the present invention. Any suitable etching can be used to remove the mask 209. A mask 211 can be formed on portions of hard mask 220 and spacer layer 240 of each fin 250, as well as N+ region 212 and P+ region 216. Mask 211 can include, for example, a silicon nitride (SiN) hardmask. The mask 211 can be deposited using a deposition process, including, but not limited to, PVD, CVD, PECVD, or any combination thereof. Other mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The mask 211 can have a single material or multiple materials. Portions of the substrate 205, N+ region 212 and the P+ region 216 can be removed using any suitable etching process, for example, a reactive ion etching process. Subsequent to the etching process, the P+ region 216 can be separated into P+ region 214 and P+ region 216.

Figure 6:
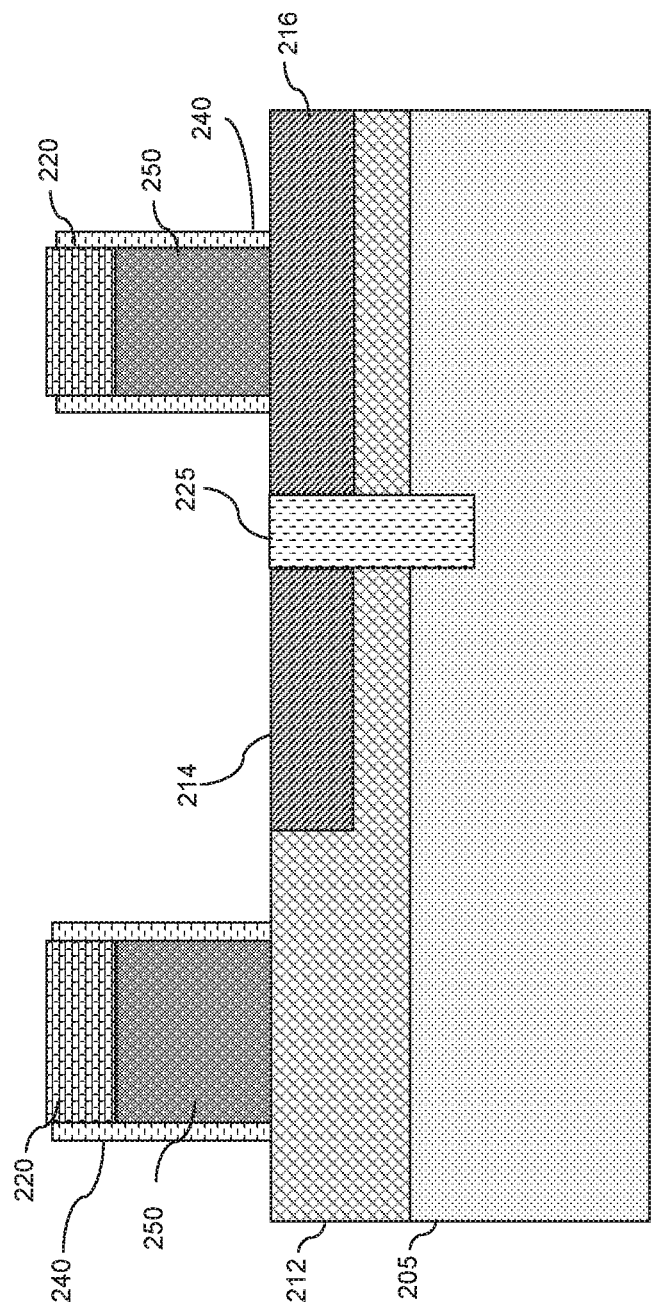
FIG. 6 is a cross-sectional view of the structure after the removal of the second mask and deposition of a shallow trench isolation (STI) according to one or more embodiments of the present invention.

FIG. 6 is a cross-sectional view of the structure 200 after the removal of the second mask 211 and deposition of a shallow trench isolation (STI). Any suitable etching can be used to remove the mask 211.

The STI 225 area can be formed in the substrate 205 and along portions of the N+ region and the P+ region 216. The shallow trench isolation 225 can be formed using standard lithography processes. Forming the shallow trench isolation 225 can include etching a pattern of trenches through the doped layer 210 (illustrated as N+ region 212, P+ region 214 and P+ region 216 (i.e., the bottom S/D) into the substrate 205, depositing one or more dielectric materials to fill the trenches, and removing the excess dielectric.

The STI 225 can include any dielectric material including inorganic dielectrics or organic dielectrics. Some examples of suitable dielectrics that can be used as the dielectric material include, but are not limited to: silicon oxide, silsequioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The STI 225 can be deposited by spin on processes, PECVD processes or the like as is generally known in the art.

Figure 7:
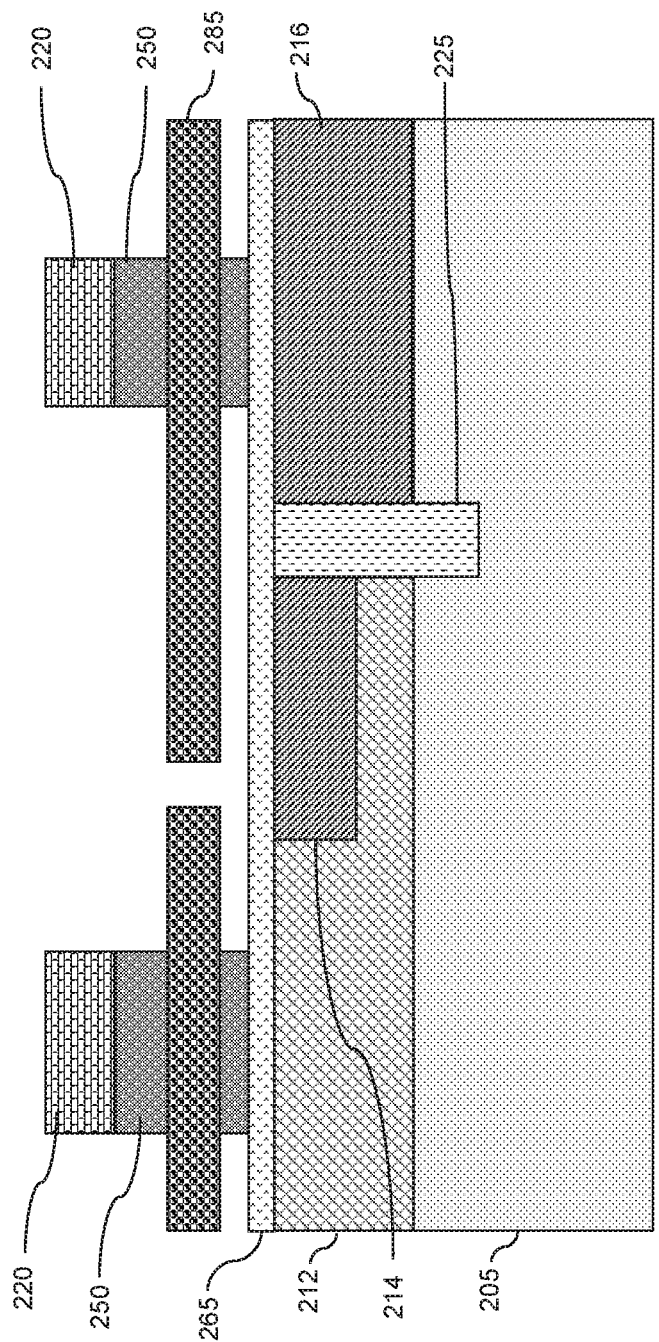
FIG. 7 is a cross-sectional view of the structure after removal of the sacrificial layer, deposition of a bottom spacer and gate formation according to one or more embodiments of the present invention.

FIG. 7 is a cross-sectional view of the structure 200 after removal of the sacrificial layer 240, deposition of a bottom spacer 265 and gate 285 formation according to one or more embodiments of the present invention. The spacer layer 240 can be removed using any suitable etching process. A bottom spacer layer 265 can be directionally deposited onto STI 225, N+ region 212, P+ region 214 and P+ region 216. The bottom spacer layer 265 can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of bottom spacer, an etch-back process is performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the bottom spacer 265 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

The metal gate 285 can be formed along portions of fin 250. Metal gate 285 can be formed using any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. A high-dielectric constant (high-k) layer (not shown) can be deposited as a gate dielectric prior to the formation of the metal gate 285.

Figure 8:
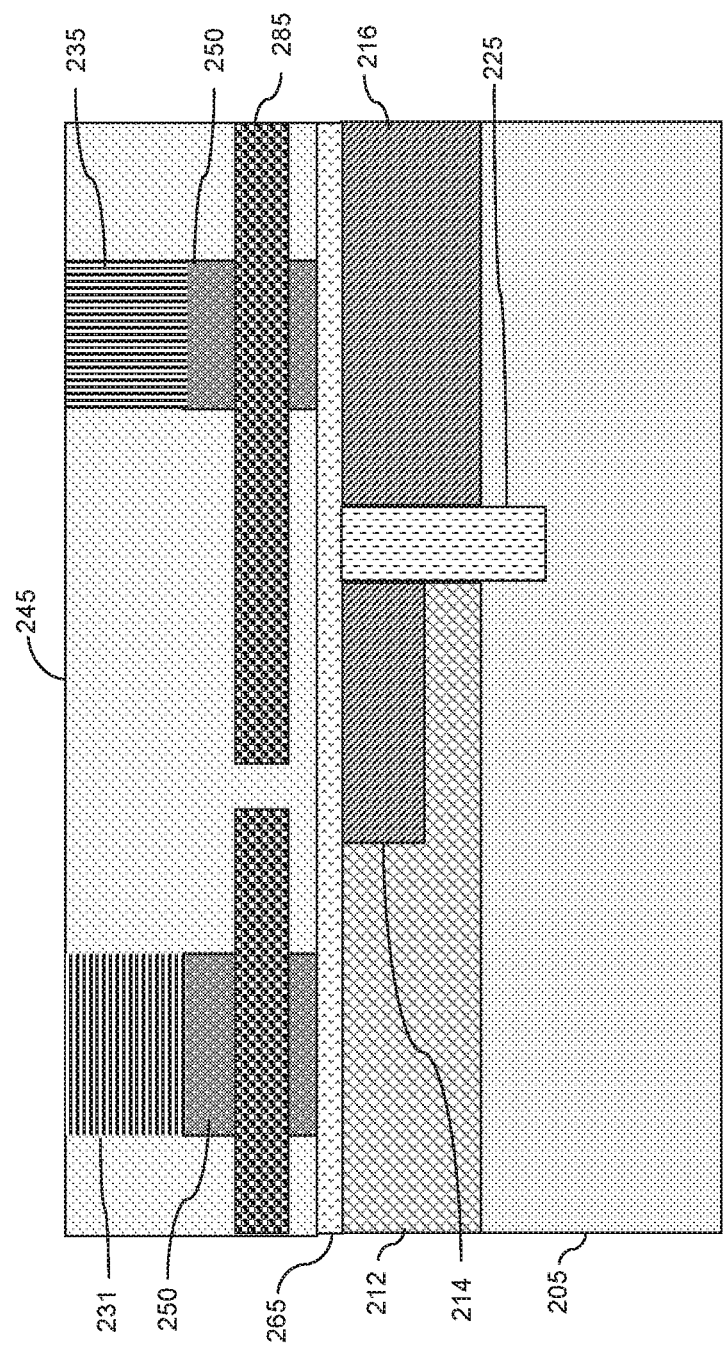
FIG. 8 is a cross-sectional view of the structure after the removal of the hard mask and the deposition of a top spacer and top S/Ds according to one or more embodiments of the present invention.

FIG. 8 is a cross-sectional view of the structure 200 after removal of hard mask 220 and the deposition of a top spacer 245 and top S/Ds 231 and 235 according to one or more embodiments of the present invention. Hard mask 220 can be removed using any suitable process. The top spacer 245 can be formed along portions of fins 250, hard mask 220, gate 285 and bottom spacer 265.

The top spacer layer 245 can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of bottom spacer, an etch-back process is performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the top spacer 245 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

Epitaxial top S/Ds 231 and 235 can be formed by the growth of the epitaxy associated with each of the fins 250 using a low temperature deposition process. For an nFET, the epitaxial top S/D 231 can be doped with an n-type dopant, such as, e.g., As or P, and the epitaxial layer can be Si, SiC, etc. For a pFET, the epitaxial top S/D 235 can be doped with a p-type dopant, such as, e.g., B, and the epitaxial layer can be SiGe, Si, etc.

Epitaxial materials can be grown from gaseous or liquid precursors. Epitaxial materials can be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Epitaxial silicon, silicon germanium (SiGe), germanium (Ge), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the S/D can range from about $1\times10^{19}$ $cm^{-3}$ to about $3\times10^{21}$ $cm^{-3}$, or in one or more other embodiments, can be in a range from about $2\times10^{20}$ $cm^{-3}$ and about $3\times10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 9:
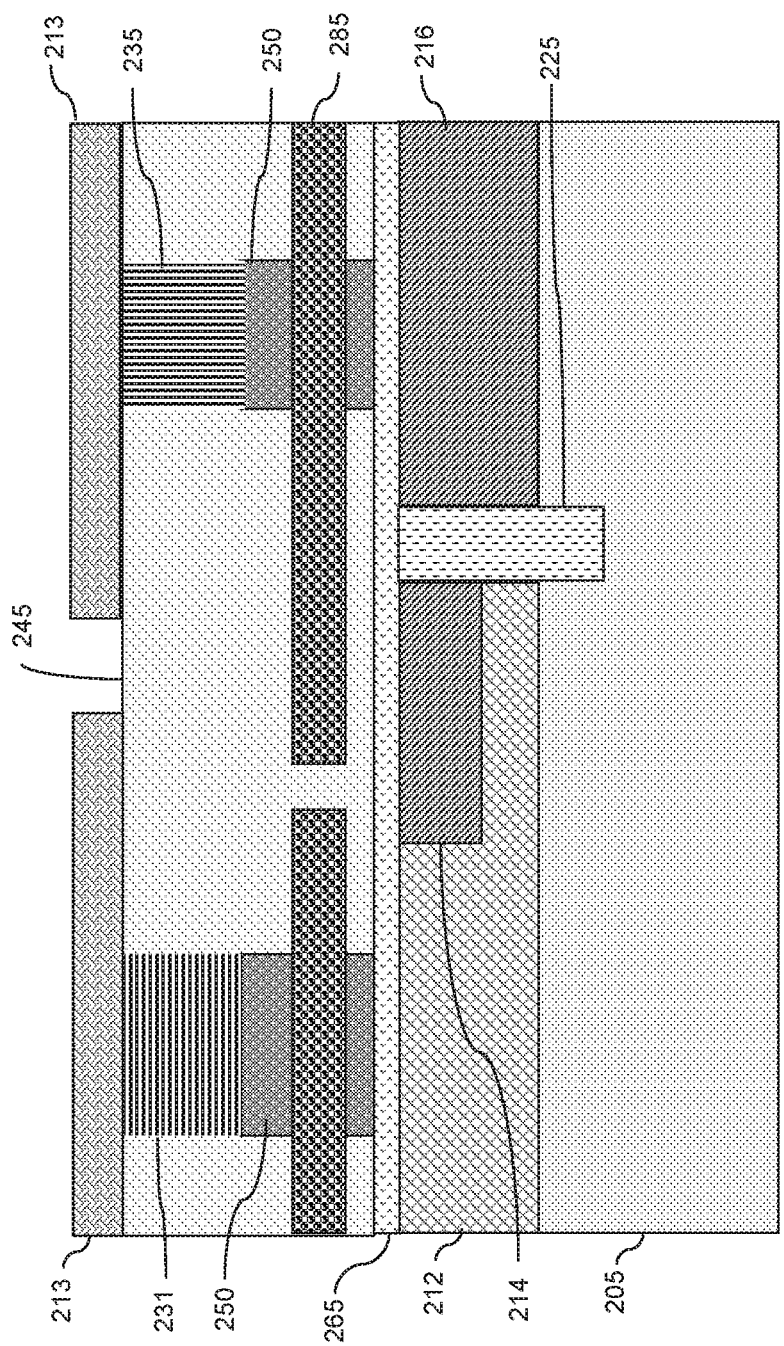
FIG. 9 is a cross-sectional view of the structure after the deposition of a third mask according to one or more embodiments of the present invention.

FIG. 9 is a cross-sectional view of the structure 200 after the deposition of a third mask 213 according to one or more embodiments of the present invention. The mask 213 can be formed on portions of the top spacer 245 and the top S/Ds 231 and 235. Mask 213 can include, for example, a silicon nitride (SiN) hardmask. The mask 211 can be deposited using a deposition process, including, but not limited to, PVD, CVD, PECVD, or any combination thereof. Other mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The mask 213 can have a single material or multiple materials.

Figure 10:
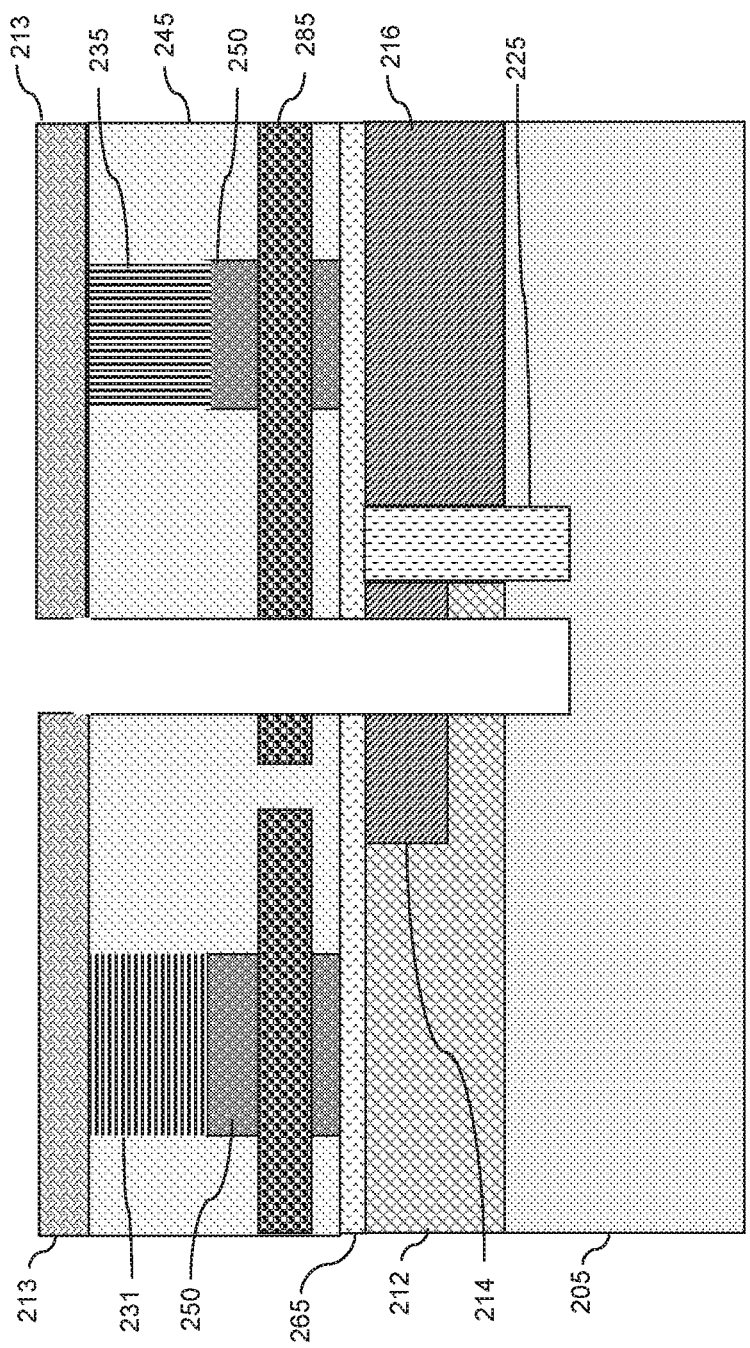
FIG. 10 is a cross-sectional view of the structure after removal of portions of substrate, N+ region, the P+ region, the top spacer and the gate according to one or more embodiments of the present invention.

FIG. 10 is a cross-sectional view of the structure 200 after removal of portions of substrate 205, N+ region 212, the P+ region 214, spacer 245 and gate 285 according to one or more embodiments of the present invention. Portions of the substrate 205, N+ region 212, the P+ region 214, spacer 245 and gate 285 can be removed using any suitable etching process, for example, a reactive ion etching process.

Figure 11:
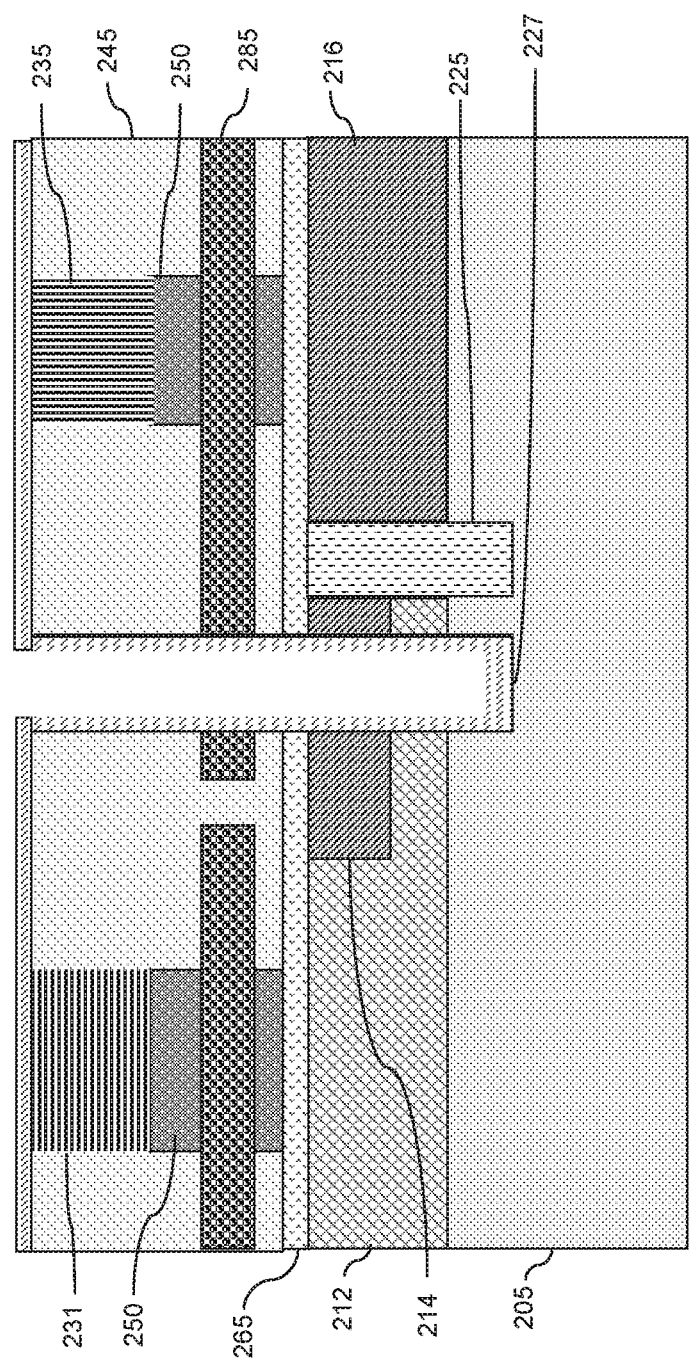
FIG. 11 is a cross-sectional view of the structure after the deposition of a liner material as wetting layer for contact metal according to one or more embodiments of the present invention.

FIG. 11 is a cross-sectional view of the structure 200 after deposition of a liner 227 as contact metal wetting (adhesion) layer according to one or more embodiments of the present invention. The liner 227 can be any suitable material, including but not limited to titanium nitride (TiN), titanium aluminum nitride (TiAlN), tantalum nitride (TaN), a carbide, including but not limited to titanium carbide (TiC) titanium aluminum carbide (TiAlC), tantalum carbide (TaC), or Tungsten carbide (WC), and combinations thereof. Liner 227 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Figure 12:
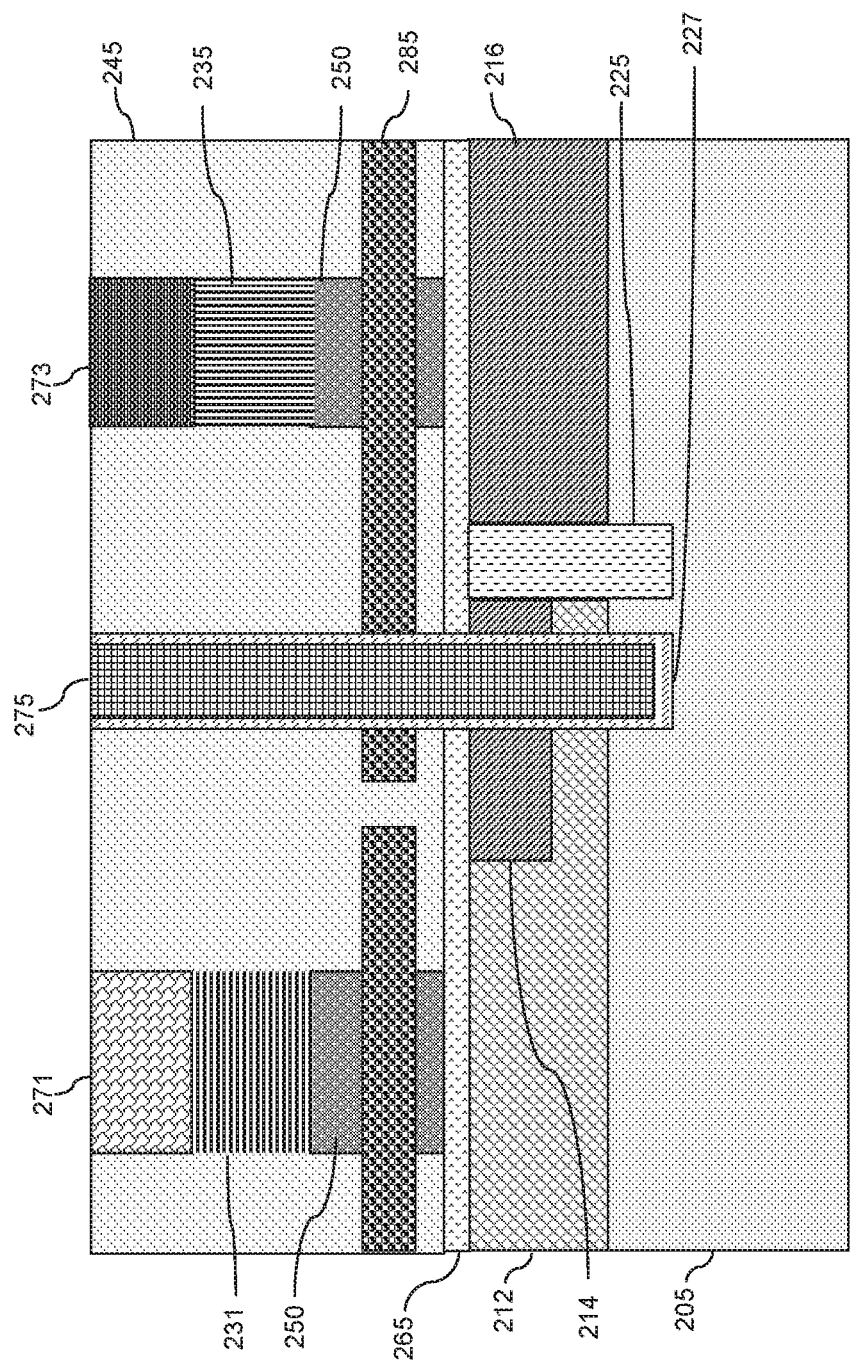
FIG. 12 is a cross-sectional view of a VFET structure after formation of contacts CA, CB and BC according to one or more embodiments of the present invention.

FIG. 12 is a cross-sectional view of a VFET structure 100 that results after the removal of portions of liner 227 and formation of contacts CA 271, CB 273 and bottom contact (BC) 275 according to one or more embodiments. Any suitable etching can be used to remove portions of the liner 227. The formation of contacts CA 271, CB 273 and BC 275 can occur during a middle of the line process to provide electrical connections between transistors.

Contacts CA 271, CB 273 and BC 275 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. Contacts CA 271, CB 273 and BC 275 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

CA 271 and CB 273 can be formed atop top S/Ds 231 and 235, respectively. The liner 227 can be etched using any suitable process to remove portions of the liner 227. BC 275 can be formed in the removed portion of the liner 227. Accordingly, the BC 275 extends through gate 285, N+ region 212 and P+ region 214 and can be self-aligned to the metal gate 285. By using BC 275, an extra area is not needed to electrically connect N+ and P+ using a specialty metal.

Figure 13:
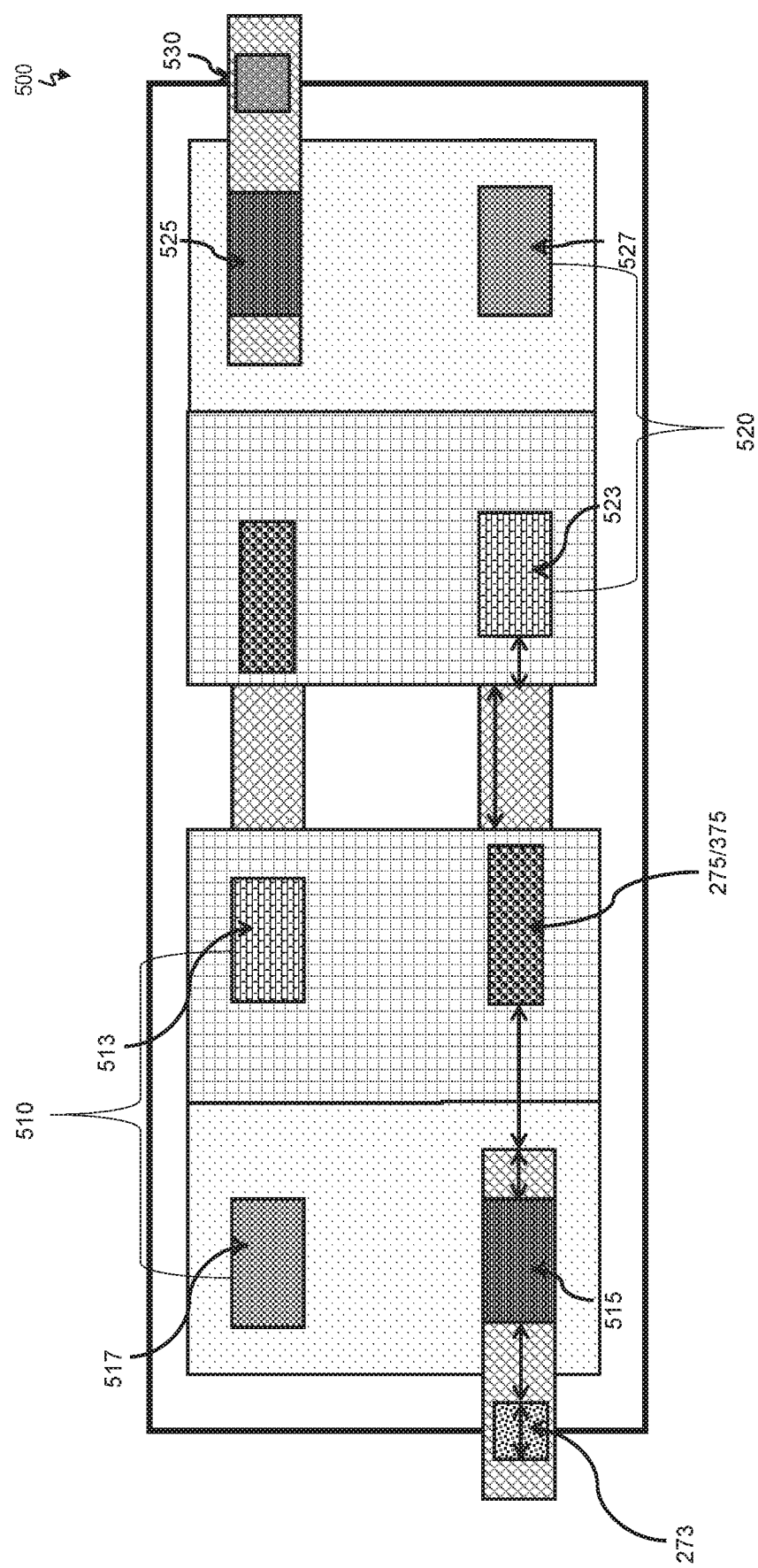
FIG. 13 is a plan view of an SRAM bit-cell layout according to one or more embodiments of the present invention.

FIG. 13 is a plan view of the SRAM bit-cell layout 500 according to one or more embodiments of the present invention. The layout 500 includes six transistors: two pairs of complementary VFET transistors (510 and 520, respectively) in which each pair includes pull-up (513 and 523, respectively) and pull-down transistors (517 and 527, respectively). The layout 500 also includes two VFET pass-gate (NFET) transistors (515 and 525, respectively). The layout 500 also includes CB 273 and BC 275, which can be self-aligned to a pass gate, for example, pass gate 515. CA 271 is not shown. Accordingly, the gate in layout 500 can be cross-coupled to a bottom S/D.

A pass gate, for example, pass gate 525, can serve as a bit line for the SRAM. The pass gate serving as the bit line can be connected to a word line node (WL) 530. Pull-down 513 can serve as a ground node (VS S) and pull-up transistor 515 can serve as a voltage source node (VDD). The transistors of layout 500 can be created using a plurality of VFET structures 100.

Accordingly, embodiments described herein provide methods and structures for forming a VFET having a self-aligned bottom contact with a low profile due to the bottom contact extending through a gate and being set within an N+ region and P+ region. The self-aligned bottom contact described herein improves overall SRAM density by removing several key feature size and overlay tolerances. The bottom contact can connect an adjacent SRAM gate to the bottom S/D, N+ and P+ regions without an additional overlay error.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a plurality of transistors, wherein each of the plurality of transistors comprises:
a vertical fin, wherein the vertical fin comprises a bottom source or drain (S/D) and a top (S/D) each formed in a doped region and a gate wrapping around a channel region; and
a bottom contact in electrical contact with each of the gate, a first doped region, and a second doped region, the first doped region and the second doped region being in direct contact with one another and positioned on a same side of the gate;
wherein each of the plurality of transistors is operably connected to form the semiconductor device.

2. The semiconductor device of claim 1, wherein the bottom contact extends through the gate.

3. The semiconductor device of claim 1, wherein the bottom contact cross-couples the gate to the bottom S/D.

4. The semiconductor device of claim 1, wherein portions the first doped region extends below the second doped region.

5. The semiconductor device of claim 1, wherein the semiconductor device comprises a memory cell.

6. The semiconductor device of claim 5, wherein the memory cell comprises a static random access memory cell.

7. A semiconductor device comprising:
a plurality of transistors, wherein each of the plurality of transistors comprises:
a vertical fin, wherein the vertical fin comprises a bottom source or drain (S/D) and a top (S/D) each formed in a doped region and a gate wrapping around a channel region; and
a bottom contact connected to the gate, a first doped region, and a second doped region, the first doped region and the second doped region being in direct contact with one another and positioned on a same side of the gate;
wherein each of the plurality of transistors is operably connected to form the semiconductor device; and
wherein the bottom contact is formed in a removed portion of the first doped region and the second doped region.

8. The semiconductor device of claim 7, wherein the bottom contact extends through the gate.

9. The semiconductor device of claim 7, wherein the bottom contact cross-couples the gate to the bottom S/D.

10. The semiconductor device of claim 7, wherein portions the first doped region extends below the second doped region.

11. The semiconductor device of claim 7, wherein the semiconductor device comprises a memory cell.

12. The semiconductor device of claim 11, wherein the memory cell comprises a static random access memory cell.

* * * * *